(12) United States Patent
Miyagi et al.

(10) Patent No.: US 10,627,205 B2
(45) Date of Patent: Apr. 21, 2020

(54) VEHICLE MANIPULATION DETECTING DEVICE

(71) Applicants: AISIN SEIKI KABUSHIKI KAISHA, Kariya-shi (JP); HONDA MOTOR CO., LTD., Minato-ku (JP)

(72) Inventors: Ayaka Miyagi, Kariya (JP); Hiroshi Shingu, Wako (JP); Kenichiro Kagawa, Wako (JP); Toshihiro Kaneda, Wako (JP)

(73) Assignees: AISIN SEIKI KABUSHIKI KAISHA, Kariya-shi (JP); HONDA MOTOR CO., LTD., Minato-ku (JP)

( * ) Notice: Subject to any disclaimer, the term of this patent is extended or adjusted under 35 U.S.C. 154(b) by 135 days.

(21) Appl. No.: 15/891,931

(22) Filed: Feb. 8, 2018

(65) Prior Publication Data

US 2018/0238672 A1    Aug. 23, 2018

(30) Foreign Application Priority Data

Feb. 21, 2017  (JP) .................................. 2017-030126

(51) Int. Cl.
| | |
|---|---|
| *G01B 7/00* | (2006.01) |
| *E05F 15/73* | (2015.01) |
| *E05B 83/40* | (2014.01) |
| *E05B 81/78* | (2014.01) |
| *H03K 17/955* | (2006.01) |

(Continued)

(52) U.S. Cl.
CPC .............. *G01B 7/003* (2013.01); *E05B 81/77* (2013.01); *E05B 81/78* (2013.01); *E05B 83/40* (2013.01); *E05F 15/73* (2015.01); *G01V 3/08* (2013.01); *G01V 3/088* (2013.01); *G06F 3/03547* (2013.01); *H03K 17/955* (2013.01); *H03K 17/9622* (2013.01); *E05F 15/632* (2015.01); *E05Y 2400/852* (2013.01); *E05Y 2400/86* (2013.01); *E05Y 2800/672* (2013.01);
(Continued)

(58) Field of Classification Search
None
See application file for complete search history.

(56) References Cited

U.S. PATENT DOCUMENTS 8,482,303 B2 * 7/2013 Van Gastel ............. E05B 81/78
324/679

FOREIGN PATENT DOCUMENTS

| AU | 200073120 A1 | 4/2001 |
|---|---|---|
| JP | 60-119486 A | 6/1985 |

(Continued)

OTHER PUBLICATIONS

Office Action dated Feb. 12, 2019 in Japanese Patent Application No. 2017-030126 (with English translation).

*Primary Examiner* — Paresh Patel (74) *Attorney, Agent, or Firm* — Oblon, McClelland, Maier & Neustadt, L.L.P.

(57) ABSTRACT

A vehicle manipulation detecting device includes a plurality of sensor electrodes and a shield electrode. Each of the sensor electrodes is configured to be attached to a window glass of a vehicle and output a detection signal corresponding to a capacitance changed in response to contact or approach of an object. The sensor electrodes include at least one first sensor electrode and at least one second sensor electrode. The shield electrode is arranged at a position corresponding to the first sensor electrode on an inner side of the first sensor electrode with reference to a passenger compartment of the vehicle.

15 Claims, 5 Drawing Sheets

(51) Int. Cl.
    *G06F 3/0354*     (2013.01)
    *H03K 17/96*     (2006.01)
    *G01V 3/08*     (2006.01)
    *E05F 15/632*     (2015.01)
    *E05B 81/76*     (2014.01)

(52) U.S. Cl.
    CPC .................. *E05Y 2900/531* (2013.01); *H03K 2017/9604* (2013.01); *H03K 2217/960765* (2013.01)

(56) References Cited

FOREIGN PATENT DOCUMENTS

| | | |
|---|---|---|
| JP | 6-273362 A | 9/1994 |
| JP | 2006-213206 | 8/2006 |
| WO | WO 01/22378 A1 | 3/2001 |

\* cited by examiner

VEHICLE MANIPULATION DETECTING DEVICE

BACKGROUND

The present disclosure relates to a vehicle manipulation detecting device.

Conventionally, various types of vehicle manipulation detecting devices have been proposed. For example, a vehicle manipulation detecting device described in Japanese Laid-Open Patent Publication No. 2006-213206 detects approach (manipulation) of a person to a window glass of a vehicle by detecting a change in capacitance by means of a transparent electrode arranged in the window glass.

A glass sensor employable as a vehicle manipulation detecting device described in International Publication No. 01/022378 detects approach of an object (a person) to a window glass (a double glass or a laminated glass) by detecting a change in capacitance by means of a transparent electrode layer (a detecting electrode layer) that is formed in the outer one of the two glasses that configure the window glass. Particularly, the document proposes forming a transparent electrode layer (a shield electrode layer) in the inner one of the two glasses to prevent detection of approach of an object (a person) to the window glass from inside of the passenger compartment. In this manner, detection is enabled only for approach of an object (a person) to the window glass from outside of the passenger compartment.

In the vehicle manipulation detecting device described in Japanese Laid-Open Patent Publication No. 2006-213206, the transparent electrode basically exhibits the same detection sensitivity inside and outside of the passenger compartment of the vehicle. Typically, detection outside of the passenger compartment of a vehicle tends to be influenced by the environment and disturbance as compared to detection inside of the passenger compartment. It is thus demanded that the detection sensitivity of the transparent electrode be set high for detection outside of the passenger compartment. In this case, the transparent electrode exhibits excessively high detection sensitivity inside of the passenger compartment. Inside of the passenger compartment, a seated occupant is located significantly close to the window glass. Therefore, a phenomenon that should not be detected, for example, leaning of the seated occupant against the door of the vehicle, may be detected as approach (manipulation) of a person to the window glass. This may cause erroneous detection of a manipulation by a person with respect to the window glass from inside of the passenger compartment.

Also, the glass sensor described in International Publication No. 01/022378 cannot detect approach of an object (a person), or manipulation by a person, with respect to the window glass from inside of the passenger compartment. The usability of the glass sensor is thus low.

SUMMARY

Accordingly, it is an objective of the present disclosure to provide a vehicle manipulation detecting device capable of distinguishing between manipulation of a window glass from outside of the passenger compartment of a vehicle and manipulation from inside of the passenger compartment when detecting the manipulation.

To achieve the foregoing objective, a vehicle manipulation detecting device is provided that includes a plurality of sensor electrodes and a shield electrode. Each of the sensor electrodes is configured to be attached to a window glass of a vehicle and output a detection signal corresponding to a capacitance changed in response to contact or approach of an object. The sensor electrodes include at least one first sensor electrode and at least one second sensor electrode. The shield electrode is arranged at a position corresponding to the first sensor electrode on an inner side of the first sensor electrode with reference to a passenger compartment of the vehicle.

To achieve the foregoing objective another vehicle manipulation detecting device is provided that includes a plurality of sensor electrodes and a shield electrode. Each of the sensor electrodes is configured to be attached to a window glass of a vehicle and output a detection signal corresponding to a capacitance changed in response to contact or approach of an object. The sensor electrodes include at least one first sensor electrode and at least one second sensor electrode. The shield electrode is arranged at a position corresponding to the first sensor electrode on either an inner side or an outer side of the first sensor electrode with reference to a passenger compartment of the vehicle.

Other aspects and advantages of the present disclosure will become apparent from the following description, taken in conjunction with the accompanying drawings, illustrating by way of example the principles of the disclosure.

BRIEF DESCRIPTION OF THE DRAWINGS

The disclosure, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

A vehicle manipulation detecting device according to a first embodiment will now be described.

Figure 1:
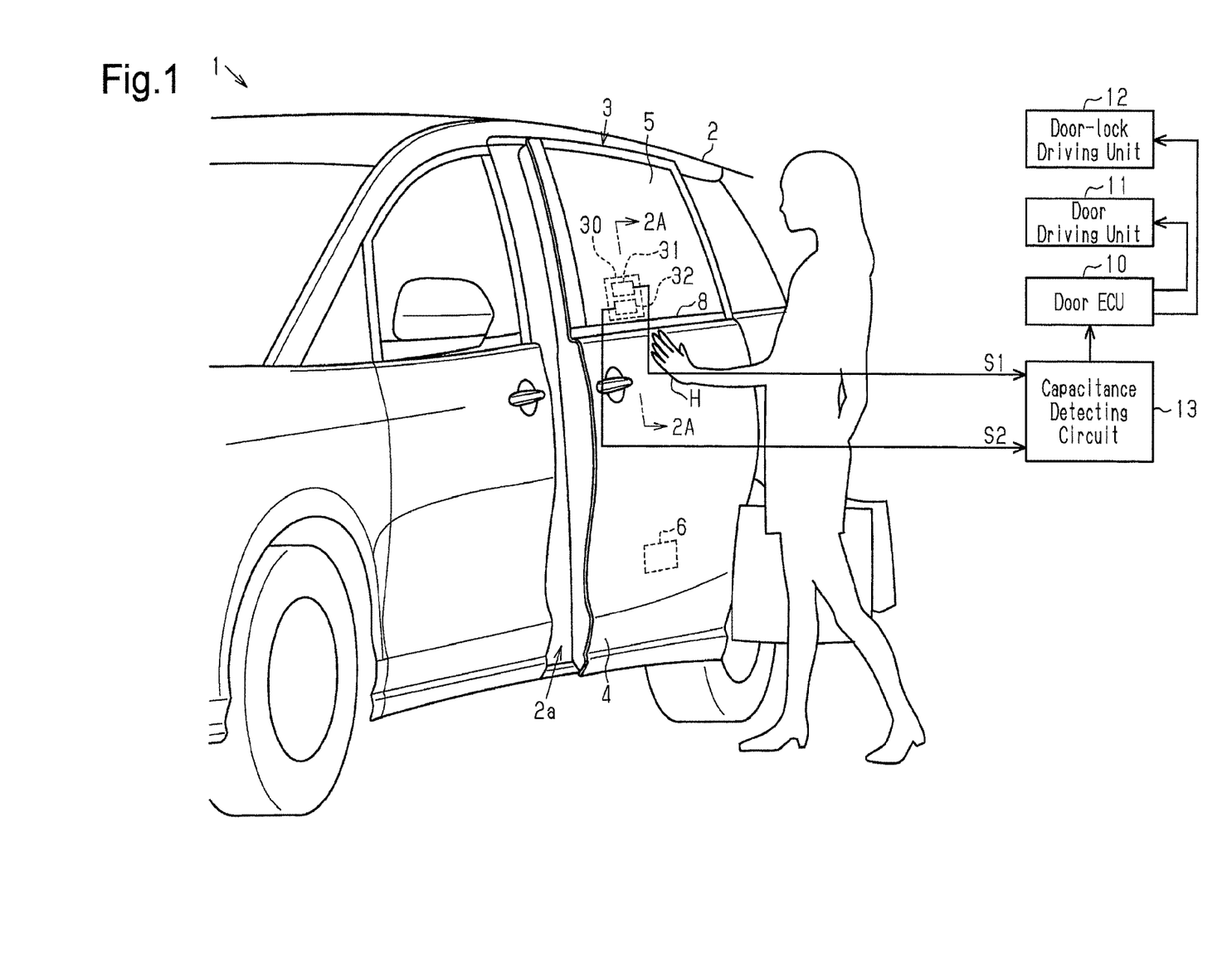
FIG. 1 is a perspective view showing a side structure of a vehicle that employs a vehicle manipulation detecting device according to a first embodiment.

As shown in FIG. 1, an opening 2a is formed in a side section of a body 2 of a vehicle 1 such as an automobile. A sliding door 3 is also mounted in the side section of the body 2 and moved in the front-rear direction to selectively open and close the opening 2a. The sliding door 3 has a door body 4 with a hollow structure and a window glass 5. The door body 4 configures the lower section of the sliding door 3. The window glass 5 selectively advances and retreats in the up-down direction with respect to the door body 4. A door lock 6 is arranged in the door body 4 to selectively lock and unlock the sliding door 3 when the sliding door 3 is in a closed state.

The sliding door 3, specifically, the door body 4, has a door driving unit 11. The door driving unit 11 is configured mainly by an electric drive source such as an electric motor. The door driving unit 11 is mechanically linked to the body 2 through a suitable door driving mechanism to drive the sliding door 3 to selectively open and close. A door-lock driving unit 12 is also arranged in the sliding door 3 adjacently to the door lock 6, for example. The door-lock driving unit 12 is configured mainly by an electric drive source such as an electric motor. The door-lock driving unit 12 is mechanically linked to the door lock 6 through a suitable lock driving mechanism to drive the door lock 6 to selectively lock and unlock the sliding door 3.

The door driving unit 11 and the door-lock driving unit 12 are both electrically connected to a door electronic control unit (ECU) 10, which includes, for example, a microcomputer unit (MCU). The door ECU 10 drives and controls the door driving unit 11 and the door-lock driving unit 12 separately from each other.

Figure 2A:
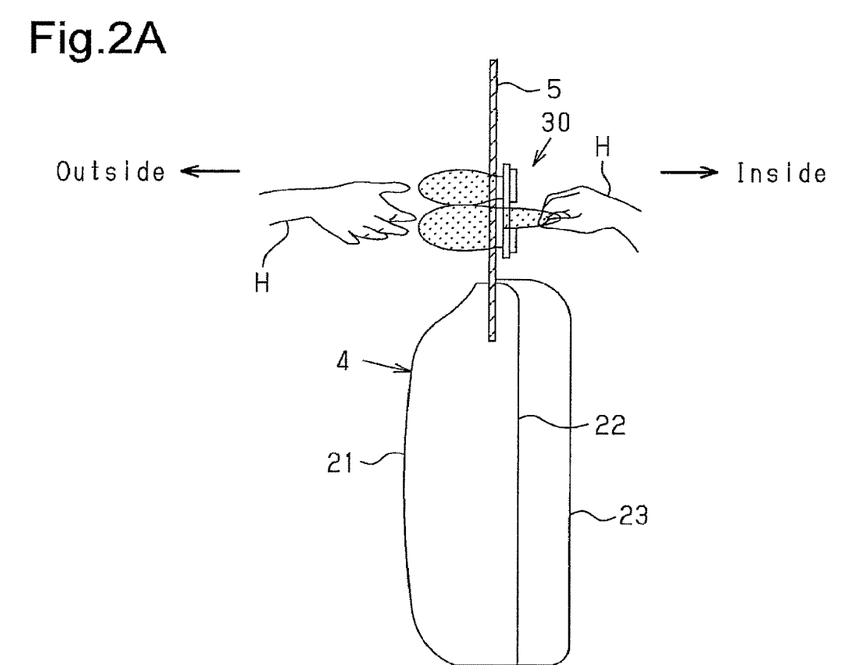
FIG. 2A is a cross-sectional view taken along line 2A-2A of FIG. 1.
Figure 2B:
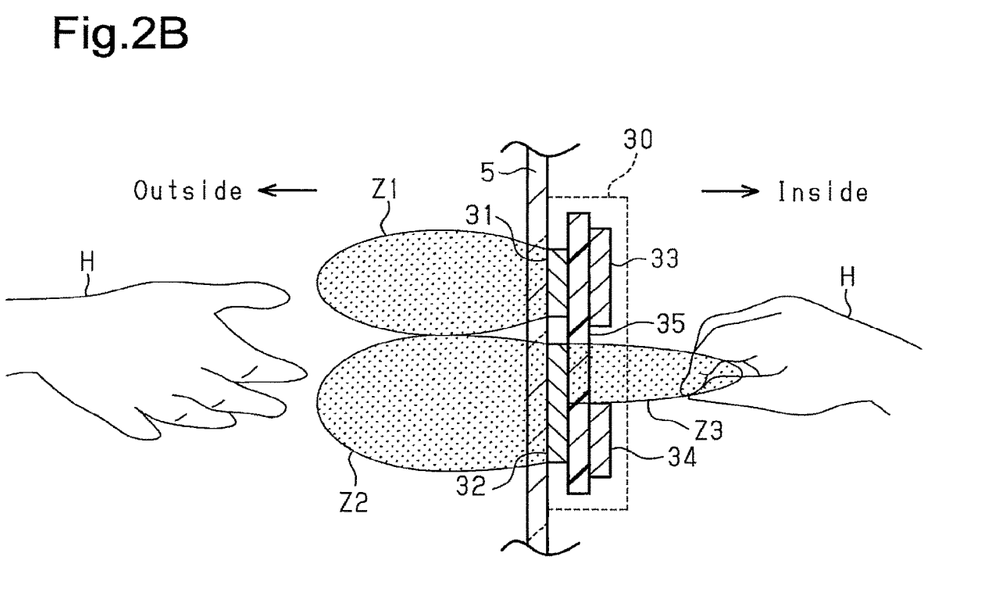
FIG. 2B is an enlarged view showing part of FIG. 2A.

The window glass 5 is provided with a substantially card-shaped sensor body 30. When the window glass 5 is in a closed state, the sensor body 30 is located immediately above the door body 4. That is, as shown in FIGS. 2A and 2B, the door body 4 has a hollow structure formed by fitting the open end of a door outer panel 21 to the open end of a door inner panel 22. The door outer panel 21 and the door inner panel 22 are formed by, for example, metal plates that are curved in a recessed manner. A door trim 23 is attached to the door inner panel 22 for decoration in the interior of the passenger compartment of the vehicle 1 (hereinafter, referred to simply as the interior). The sensor body 30 is adhered to the inner surface (the surface facing the passenger compartment) of the window glass 5 such that the sensor body 30 is located immediately above the door body 4 when the window glass 5 is in a closed state.

The sensor body 30 is a capacitance sensor and has thin membrane-like sensor electrodes 31, 32. The sensor electrodes 31, 32 are spaced apart in the up-down direction. The sensor electrodes 31, 32 are each configured to detect capacitance that is changed in response to contact or approach of an object with respect to the sensor electrodes 31, 32 from either inside or outside of the passenger compartment of the vehicle 1. Each of the sensor electrodes 31, 32 is formed substantially in a rectangular shape by, for example, a transparent electrode. The second sensor electrode 32, which is located at the lower position, has a greater surface area than the first sensor electrode 31, which is located at the upper position.

The sensor body 30 also has a first shield electrode 33. The first shield electrode 33 is arranged at a position corresponding to the first sensor electrode 31 and formed by, for example, a transparent electrode. The first shield electrode 33 is arranged on the inner side of the first sensor electrode 31 and stacked on the first sensor electrode 31. The first shield electrode 33 has a slightly greater surface area than the sensor electrode 31 to cover the entire surface of the first sensor electrode 31 from inside of the passenger compartment. That is, the first shield electrode 33 is stacked on the first sensor electrode 31 as a whole.

The sensor body 30 also has a second shield electrode 34. The second shield electrode 34 is arranged at a position corresponding to the second sensor electrode 32 and formed by, for example, a transparent electrode. The second shield electrode 34 is a shield electrode for decreasing sensitivity. The second shield electrode 34 is arranged on the inner side of the second sensor electrode 32 and stacked on the second sensor electrode 32. The second shield electrode 34 covers part of the second sensor electrode 32 from inside of the passenger compartment. As viewed in the up-down direction, the upper end of the second shield electrode 34 is located below the upper end of the second sensor electrode 32. That is, the second shield electrode 34 is stacked on the aforementioned section of the second sensor electrode 32. The lower part (part) of the second sensor electrode 32 is covered by the second shield electrode 34 for electrostatic shielding from inside of the passenger compartment. However, the upper section of the second sensor electrode 32 is not electrostatically shielded by the second shield electrode 34. The sensor body 30 also has a thin membrane-like spacer 35. The spacer 35 is formed by, for example, a transparent insulating material that is arranged between the first sensor electrode 31 and the first shield electrode 33 and between the second sensor electrode 32 and the second shield electrode 34 to be stacked on the entire surfaces of the sensor electrodes 31, 32.

As a result, the first sensor electrode 31 forms an upper detection zone Z1 that extends from the entire surface of the first sensor electrode 31 toward the outside of the passenger compartment of the vehicle 1 (hereinafter, also referred to simply as the outside). However, the first sensor electrode 31 is electrostatically shielded by the first shield electrode 33 so as not to form a detection zone that extend into the passenger compartment. On the other hand, the second sensor electrode 32 forms a lower detection zone Z2 that extends outward from the entire surface of the second sensor electrode 32. Also, since the second shield electrode 34 electrostatically shields part of the second sensor electrode 32, the second sensor electrode 32 forms a detection zone Z3 that extends inward only from part of the second sensor electrode 32 located above the shielded part. In this manner, the electrostatic shielding effects of the first shield electrode 33 and the second shield electrode 34 reduce the size of the detection zone Z3 as compared to the sizes of the detection zones Z1, Z2.

As illustrated in FIG. 1, the sensor electrodes 31, 32 are electrically connected to a capacitance detecting circuit 13. The capacitance detecting circuit 13 outputs an oscillation signal to each of the sensor electrodes 31, 32. This causes each sensor electrode 31, 32 to output a detection signal S1, S2 [V] of the voltage level corresponding to the detected capacitance. The capacitance detecting circuit 13 may output the oscillation signals and receive the corresponding detection signals S1, S2 either simultaneously for both of the sensor electrodes 31, 32 or consecutively for the sensor electrodes 31, 32 while switching between the sensor electrodes 31, 32 by a short time.

The first shield electrode 33 and the second shield electrode 34 may each be either grounded to the door body 4 or the like or electrically connected to, for example, a ground terminal of the capacitance detecting circuit 13. Alternatively, each of the first and second shield electrodes 33, 34 may be an open circuit.

Thus, each of the detection signals S1, S2 is changed in response to contact or approach of an object (for example, a finger H of a person) to the surface of the window glass 5 in the vicinity of the sensor body 30. The sensor electrodes 31, 32 output the detection signals S1, S2 to the capacitance detecting circuit 13 separately from each other. The capacitance detecting circuit 13 is electrically connected to the door ECU 10. In the present embodiment, movement of the hand H by a user (a person) toward the sensor body 30 (the window glass 5) is defined as proper regular manipulation for selectively opening and closing the sliding door 3.

For example, the movement of the hand H toward the sensor body 30 (the window glass 5) from outside of the passenger compartment when the sliding door 3 is closed is manipulation for opening the sliding door 3 and correspondingly unlocking the door lock 6. When such manipulation is carried out from outside of the passenger compartment, the detection signals S1, S2 of the two sensor electrodes 31, 32 are both changed. Also, movement of the hand H toward the sensor body 30 (the window glass 5) from inside of the passenger compartment is manipulation for opening the sliding door 3 and correspondingly unlocking the door lock 6. If the manipulation is carried out from inside of the passenger compartment, the detection signal S1 of the first sensor electrode 31 remains unchanged but the detection signal S2 of the second sensor electrode 32 is changed. This is caused by the fact that the first shield electrode 33 prohibits detection by the first sensor electrode 31 inside of the passenger compartment. Also, the electrostatic shielding effect of the second shield electrode 34, which covers part of the second sensor electrode 32 from inside of the passenger compartment, increases the detection sensitivity based on the detection signal S2 of the second sensor electrode 32 outside of the passenger compartment as compared to inside of the passenger compartment.

Figure 3:
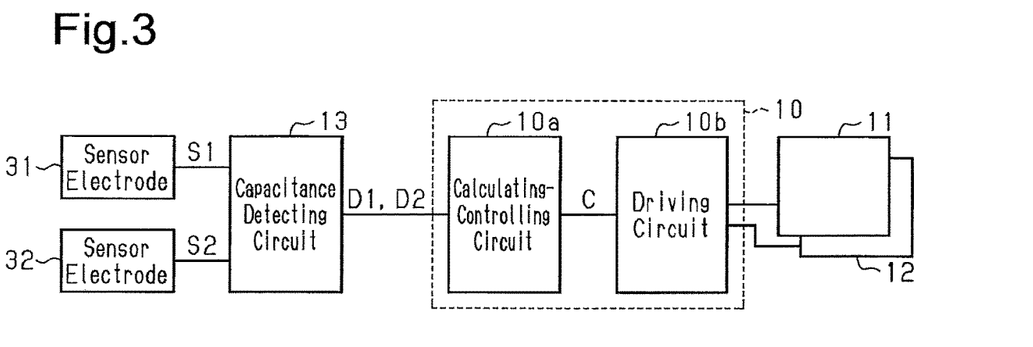
FIG. 3 is a block diagram representing the electric configuration of the vehicle manipulation detecting device of the first embodiment.

As shown in FIG. 3, the door ECU 10 has a calculating-controlling circuit 10a and a driving circuit 10b. The calculating-controlling circuit 10a is electrically connected to the capacitance detecting circuit 13. The driving circuit 10b is electrically connected to the door driving unit 11 and the door-lock driving unit 12. The capacitance detecting circuit 13 performs A/D (analog-to-digital) conversion on the detection signals S1, S2, thus generating detection data D1, D2. The capacitance detecting circuit 13 outputs the detection data D1, D2 to the calculating-controlling circuit 10a.

The calculating-controlling circuit 10a executes various types of calculation procedures based on the detection data D1, D2 and outputs a control signal C to the driving circuit 10b in correspondence with the results of the calculation procedures. The driving circuit 10b drives the door driving unit 11 and the door-lock driving unit 12 in correspondence with the control signal C.

Next, the operation of the present embodiment and its advantages will be described.

(1) In the present embodiment, when an object (such as the hand H) contacts or approaches the window glass 5 from outside of the passenger compartment of the vehicle 1, the detection signals S1, S2 of the sensor electrodes 31, 32 are changed. In contrast, if an object contacts or approaches the window glass 5 from inside of the passenger compartment of the vehicle 1, the detection signal S1 of the sensor electrode 31, which is covered by the first shield electrode 33, remains unchanged while the detection signal S2 of the sensor electrode 32, which is not covered by the first shield electrode 33, is changed. This configuration is capable of distinguishing between manipulation by a person to the window glass 5 (contact or approach of an object) from outside of the passenger compartment of the vehicle 1 and such manipulation from inside of the passenger compartment when detecting the manipulation.

(2) Typically, inside of the passenger compartment of the vehicle 1, the window glass 5 is located significantly close to a person (a seated occupant). Therefore, a phenomenon that should not be detected, for example, leaning of a person against the sliding door 3 may be erroneously detected as contact or approach of the object (manipulation) to the window glass 5. In the present embodiment, the second shield electrode 34 covers part of the sensor electrode 32 from inside of the passenger compartment to decrease the detection sensitivity of the sensor electrode 32. This further limits detectable contact or approach of an object (manipulation) inside of the passenger compartment, thus restraining erroneous detection.

(3) In the present embodiment, manipulation for selectively opening and closing the sliding door 3 is detected both outside and inside of the passenger compartment.

Second Embodiment

Hereinafter, a vehicle manipulation detecting device according to a second embodiment will be described. The second embodiment is different from the first embodiment in that a door panel is modified to be used also as a shield electrode. Detailed description of the configurations of the components of the second embodiment that are identical with the corresponding components of the first embodiment is omitted herein.

Figure 4:
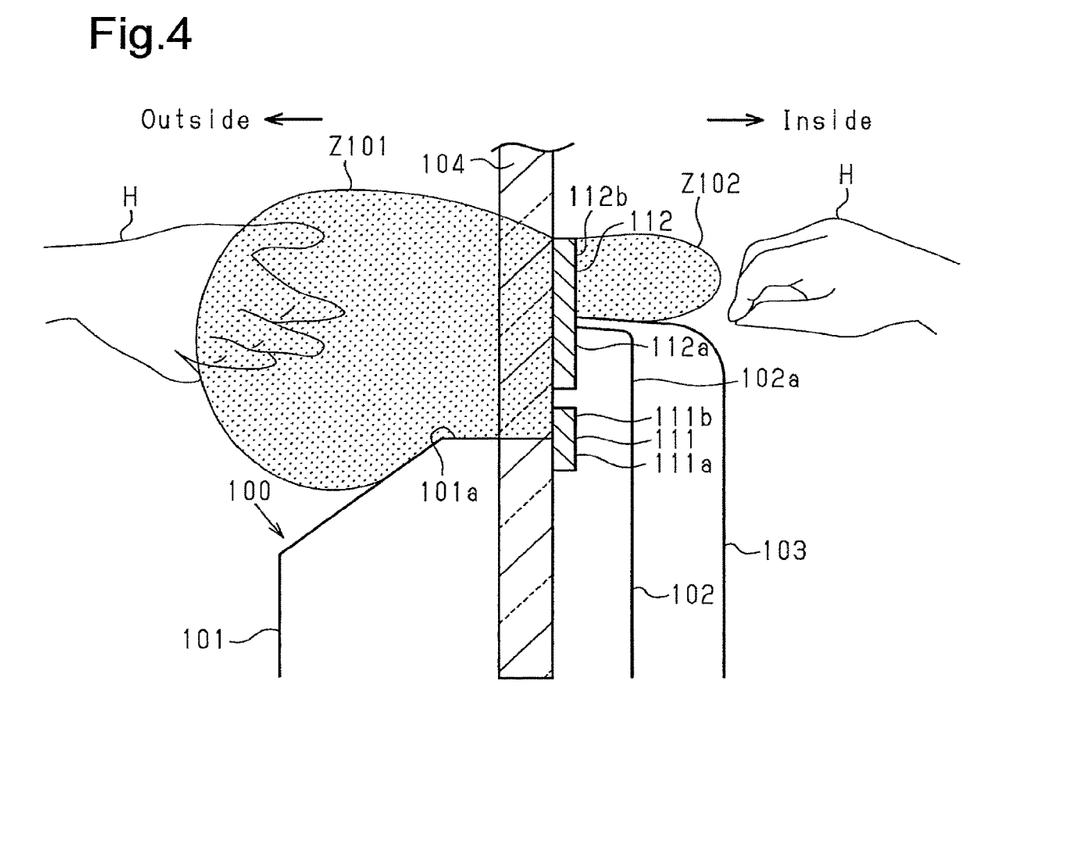
FIG. 4 is a cross-sectional view showing the structure of a vehicle manipulation detecting device according to a second embodiment.

As illustrated in FIG. 4, a door body 100 of the present embodiment has a hollow structure formed by fitting the open end of a door outer panel 101 to the open end of a door inner panel 102. The door outer panel 101 and the door inner panel 102 are formed by, for example, metal plates that are curved in a recessed manner. The upper end section of the door outer panel 101 forms an outer shield portion 101a. The upper end section of the door inner panel 102 is located above the upper end of the door outer panel 101 and forms an inner shield portion 102a. The inner shield portion 102a functions as a first shield electrode and a sensitivity decreasing shield electrode. A door trim 103 is attached to the door inner panel 102 for decoration in the interior of the passenger compartment.

A window glass 104 selectively advances and retreats with respect to the door outer panel 101 in the up-down direction. A first sensor electrode 111 and a second sensor electrode 112 are adhered to the inner surface (the surface facing the passenger compartment) of the window glass 104 and spaced apart in the up-down direction. The sensor electrodes 111, 112 are each configured to detect capacitance that is changed in response to contact or approach of an object from either inside or outside of the passenger compartment of the vehicle 1. Each sensor electrode 111, 112 is formed substantially in a rectangular shape by, for example, a transparent electrode. The first sensor electrode 111, which is located at the lower position, has a sufficiently small surface area compared to that of the second sensor electrode 112, which is located at the higher position.

When the window glass 104 is in a closed state, a middle section of the first sensor electrode 111 in the up-down direction is arranged at a position corresponding to the upper end of the door outer panel 101. The part from the middle section to the lower end of the first sensor electrode 111 is a lower section 111a. The part from the middle section to the upper end of the first sensor electrode 111 is an upper section 111b. The lower end of the first sensor electrode 111 is located below the upper end of the door outer panel 101. The upper end of the first sensor electrode 111 is located above the upper end of the door outer panel 101. The lower section 111a of the first sensor electrode 111 is covered by the outer shield portion 101a from outside of the passenger compartment. The outer shield portion 101a is arranged on the outer side of the window glass 104. That is, the lower section 111a of the first sensor electrode 111 is electrostatically shielded by the outer shield portion 101a outside of the passenger compartment. In contrast, the upper section 111b is not electrostatically shielded by the outer shield portion 101a. Also, the inner shield portion 102a covers the entire surface of the first sensor electrode 111 from inside of the passenger compartment. That is, the inner side of the first sensor electrode 111 is electrostatically shielded by the inner shield portion 102a.

On the other hand, when the window glass 104 is in a closed state, a middle section of the second sensor electrode 112 in the up-down direction is arranged at a position corresponding to the upper end of the door inner panel 102. The part from the middle section to the lower end of the second sensor electrode 112 is a lower section 112a. The part from the middle section to the upper end of the second sensor electrode 112 is an upper section 112b. The lower end of the second sensor electrode 112 is located below the upper end of the door inner panel 102. The upper end of the second sensor electrode 112 is located above the upper end of the door inner panel 102. The lower section 112a of the second sensor electrode 112 is covered by the inner shield portion 102a from inside of the passenger compartment. That is, the inner side of the lower section 112a of the second sensor electrode 112 is electrostatically shielded by the inner shield portion 102a. In contrast, the upper section 112b is not electrostatically shielded by the inner shield portion 102a. Further, the surface of the second sensor electrode 112 is not entirely covered by the outer shield portion 101a from outside of the passenger compartment.

As a result, the upper section 111b of the first sensor electrode 111 and the entire surface of the second sensor electrode 112 form a detection zone Z101 that extends outward. In contrast, the inner shield portion 102a electrostatically shields the entire surface of the first sensor electrode 111 and the lower section 112a of the second sensor electrode 112 so as not to form a detection zone that extends into the passenger compartment. The upper section 112b of the second sensor electrode 112 forms a detection zone Z102 that extends into the passenger compartment. The electrostatic shielding effect of the inner shield portion 102a reduces the size of the detection zone Z102 as compared to the size of the detection zone Z101.

The sensor electrodes 111, 112 are electrically connected to the capacitance detecting circuit 13 as in the first embodiment. In the present embodiment, movement of the hand H by the user (a person) toward the sensor electrodes 111, 112 (the window glass 104) is defined as proper regular manipulation for selectively opening and closing the sliding door 3. Therefore, for example, when the sliding door 3 is closed and the hand H is moved toward the sensor electrodes 111, 112 (the window glass 104) from outside of the passenger compartment, the detection signals of the two sensor electrodes 111, 112 are both changed. If the hand H is moved toward the sensor electrodes 111, 112 (the window glass 104) from inside of the passenger compartment, the detection signal of the first sensor electrode 111 remains unchanged and only the detection signal of the second sensor electrode 112 is changed. This is caused by the fact that detection by the first sensor electrode 111 inside of the passenger compartment is prohibited by the inner shield portion 102a. Also, the electrostatic shielding effect of the inner shield portion 102a, which covers part of the second sensor electrode 112 from inside of the passenger compartment, increases the detection sensitivity based on the detection signal of the second sensor electrode 112 outside of the passenger compartment as compared to inside of the passenger compartment.

According to the present embodiment as described above, the following advantages are obtained in addition to the advantages of the first embodiment.

(1) In the present embodiment, the first shield electrode is configured by the door inner panel 102 (the inner shield portion 102a). This makes it unnecessary to arrange a dedicated electrode as the first shield electrode, thus decreasing the number of components.

(2) In the present embodiment, the sensitivity decreasing shield electrode is configured by the door inner panel 102 (the inner shield portion 102a). This makes it unnecessary to arrange a dedicated electrode as a sensitivity adjusting electrode, thus decreasing the number of components.

Third Embodiment

A vehicle manipulation detecting device according to a third embodiment will now be described. The third embodiment is a modification of the first embodiment that has a greater number of sensor electrodes to detect manipulation by a person from outside and inside of the passenger compartment. Detailed description of the configurations of the components of the third embodiment that are identical with the corresponding components of the first embodiment is omitted herein.

Figure 5:
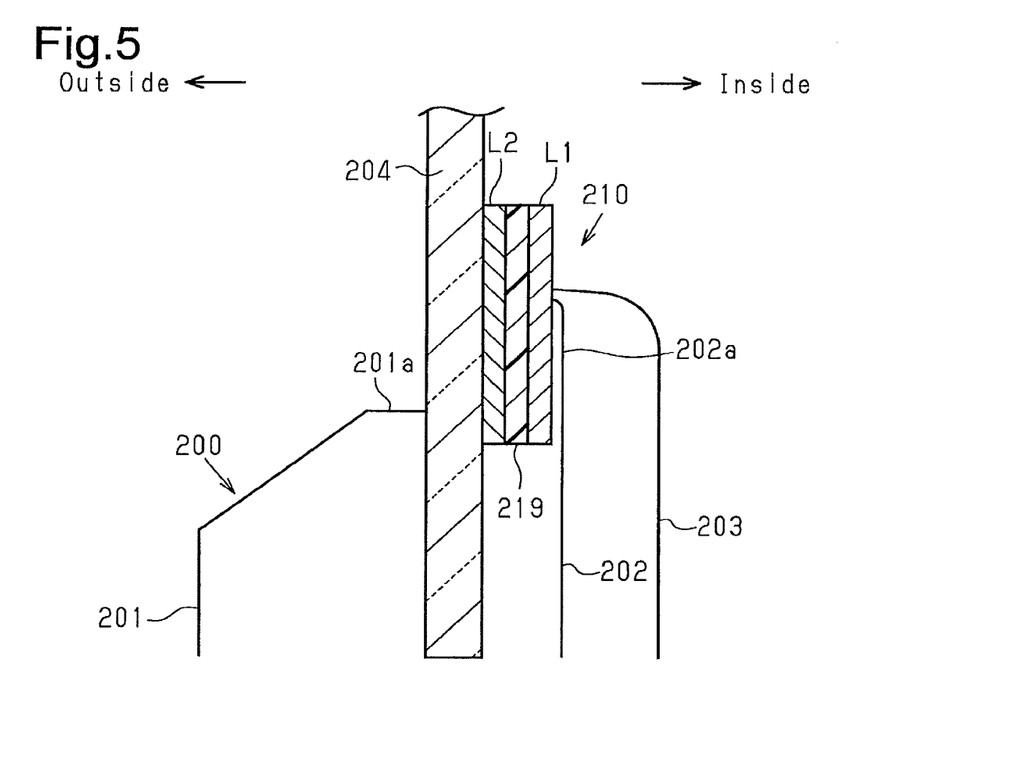
FIG. 5 is a cross-sectional view showing the structure of a vehicle manipulation detecting device according to a third embodiment.

As shown in FIG. 5, a door body 200 of the present embodiment has a hollow structure formed by fitting the open end of a door outer panel 201 to the open end of a door inner panel 202. The door outer panel 201 and the door inner panel 202 are formed by, for example, metal plates that are curved in a recessed manner. The upper end section of the door outer panel 201 forms an outer shield portion 201a. The upper end section of the door inner panel 202 forms an inner shield portion 202a. The inner shield portion 202a is located above the upper end of the door outer panel 201 and functions as a sensitivity decreasing shield electrode. A door trim 203 is attached to the door inner panel 202 for decoration in the interior of the passenger compartment.

A window glass 204 selectively advances and retreats with respect to the door outer panel 201 in the up-down direction. A sensor body 210 is arranged on the inner surface (the surface facing the passenger compartment) of the window glass 204. When the window glass 204 is in a closed state, the lower end of the sensor body 210 is arranged slightly below a position corresponding to the upper end of the door outer panel 101. A middle section of the sensor body 210 in the up-down direction is arranged at a position corresponding to the upper end of the door inner panel 202.

Figure 6:
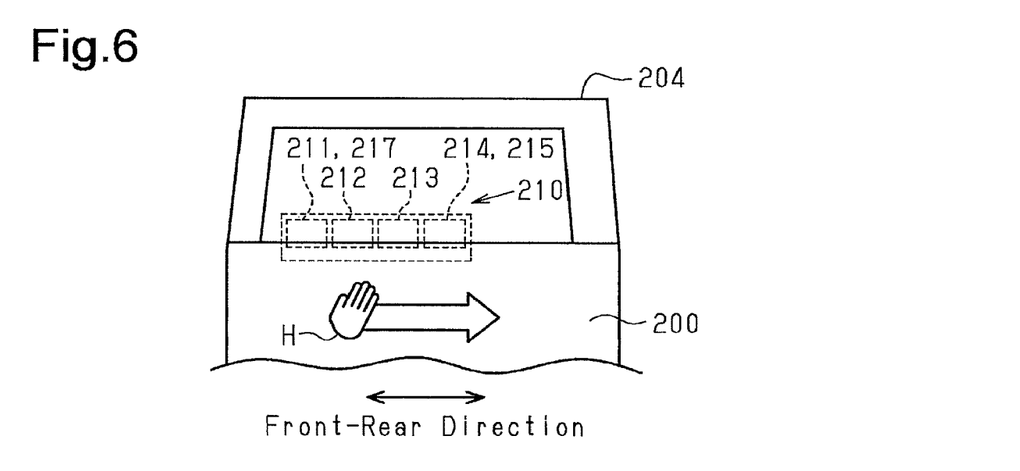
FIG. 6 is a front view showing the structure of the vehicle manipulation detecting device of the third embodiment.
Figure 7:
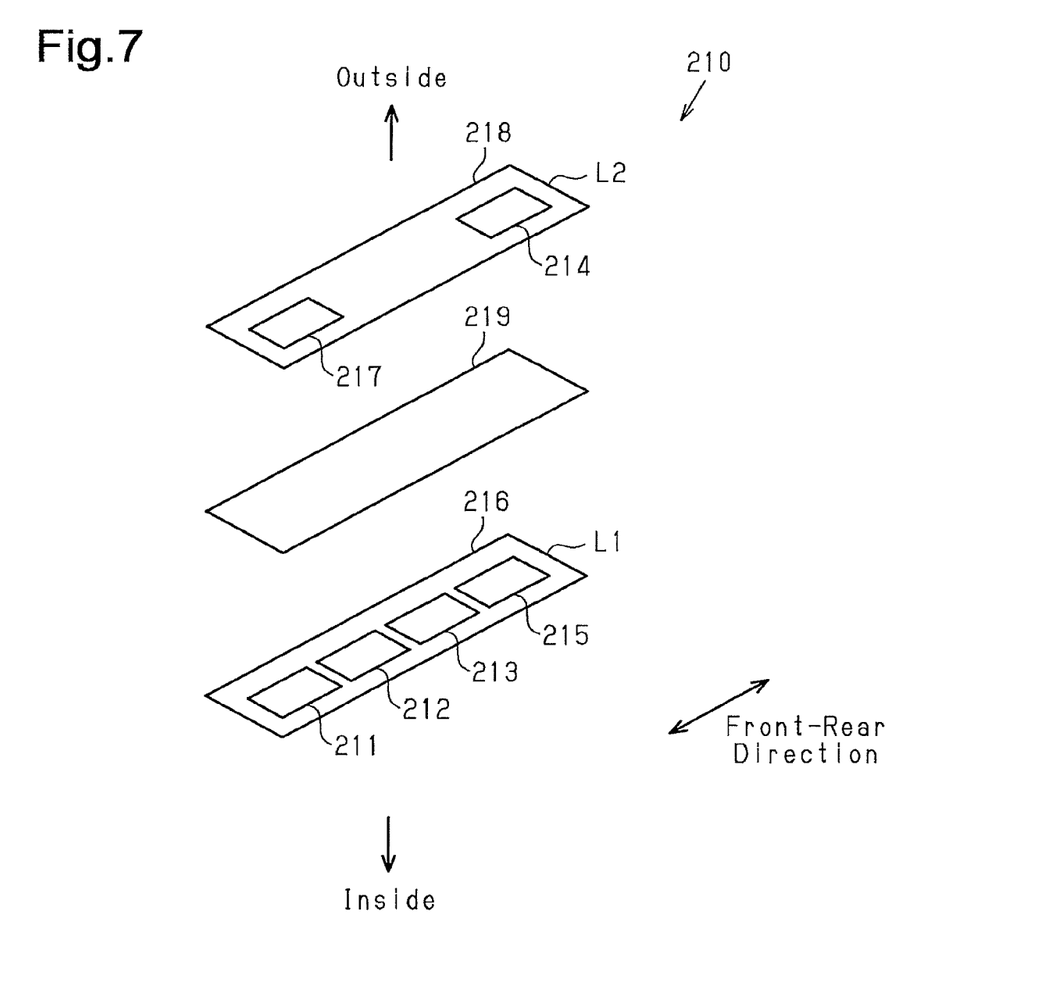
FIG. 7 is an exploded perspective view showing the structure of the vehicle manipulation detecting device of the third embodiment.

As shown in FIGS. 6 and 7, the sensor body 210 includes a first electrode layer L1, which has sensor electrodes 211, 212, 213, a first shield electrode 215, and a substrate 216. The sensor electrodes 211, 212, 213 and the first shield electrode 215 are spaced apart in the front-rear direction (in the horizontal direction). The electrodes 211 to 213 and 215 are formed on the substrate 216. The sensor electrodes 211 to 213 and the first shield electrode 215 are formed substantially in the same shape (substantially in rectangular shapes) by, for example, transparent electrodes. The sensor body 210 also includes a second electrode layer L2, which has a first sensor electrode 214, a second shield electrode 217, and a substrate 218. The first sensor electrode 214 faces the first shield electrode 215. The second shield electrode 217 faces the second sensor electrode 211. The electrodes 214, 217 are formed on the substrate 218. The first sensor electrode 214 and the second shield electrode 217 are formed substantially in the same shapes as those of the sensor electrode 211 and the like by, for example, transparent electrodes. The sensor body 210 further has a thin membrane-like spacer 219. The spacer 219 is arranged between the first and second electrode layers L1, L2 to be stacked on the entire areas of the first and second electrode layers L1, L2 and is made of, for example, insulating material. That is, the sensor body 210 has a three-layer structure formed by the first electrode layer L1, the second electrode layer L2, and the spacer 219. The four sensor electrodes 211 to 214 (three or more sensor electrodes) are aligned substantially in the front-rear direction (in a certain direction) along the window glass 204.

As illustrated in FIG. 5, the sensor body 210 is adhered to the surface of the inner surface of the window glass 204 at the second electrode layer L2. When the window glass 204 is in a closed state, the sensor body 210 (that is, the sensor electrodes 211 to 214 and the like) are arranged such that a section of the sensor body 210 is concealed by the door outer panel 201 (the outer shield portion 201a). In this case, parts (the lower end sections) of the sensor electrodes 211 to 214 are covered by the door outer panel 201 through the window glass 204 from outside of the passenger compartment. However, the door outer panel 201 covers only a limited surface area and thus influences the detection sensitivity of the sensor electrodes 211 to 214 only slightly.

When the window glass 204 is in a closed state, the sensor body 210 is arranged such that the lower half of the sensor body 210 is concealed by the door inner panel 202 (the inner shield portion 202a). The parts of the sensor electrodes 211 to 214 corresponding to the lower half of the sensor body 210 are thus covered by the door inner panel 202 from inside of the passenger compartment. This decreases the detection sensitivity of the sensor electrodes 211 to 214 inside of the passenger compartment.

Particularly, the second shield electrode 217 is arranged at the position corresponding to the second sensor electrode 211 on the outer side of the second sensor electrode 211. The second sensor electrode 211 is thus electrostatically shielded by the second shield electrode 217 so as not to form a detection zone that extends outward. Also, the first shield electrode 215 is arranged at the position corresponding to the first sensor electrode 214 on the inner side of the first sensor electrode 214. The first sensor electrode 214 is thus electrostatically shielded by the first shield electrode 215 so as not to form a detection zone that extends into the passenger compartment.

As a result, each of the sensor electrodes 212 to 214 forms a detection zone that extends outward substantially from the entire surface of the sensor electrode 212 to 214. Each of the sensor electrodes 211 to 213 forms a detection zone that extends inward from the corresponding surface of the upper half of the sensor electrode 211 to 213. Each of the detection zones that extend into the passenger compartment is reduced in size as compared to each of the detection zones that extend outward. That is, each of the third sensor electrodes 212, 213 forms the detection zone that extends outward substantially from the entire surface of the sensor electrode 212, 213 and the detection zone that extends from the corresponding surface of the upper half of the sensor electrode 212, 213 into the passenger compartment.

The sensor electrodes 211 to 214 are electrically connected to the capacitance detecting circuit 13 as in the first embodiment. In the present embodiment, movement of the hand H by the user (a person) toward the window glass 204 and then in the front-rear direction along the sensor electrodes 211 to 214 is defined as proper regular manipulation for selectively opening and closing the sliding door 3. Therefore, for example, when the sliding door 3 is closed and the hand H is moved toward the window glass 204 from outside of the passenger compartment and then in the front-rear direction along the sensor electrodes 211 to 214, the detection signals of the sensor electrodes 212 to 214 are changed, but not the detection signal of the sensor electrode 211. This is caused by the fact that detection by the second sensor electrode 211 outside of the passenger compartment is prohibited by the second shield electrode 217. In contrast, when the hand H is moved toward the window glass 204 from inside of the passenger compartment and then in the front-rear direction along the sensor electrodes 211 to 214, the detection signals of the sensor electrodes 211 to 213 are changed, but not the detection signal of the sensor electrode 214. This is caused by the fact that detection by the first sensor electrode 214 inside of the passenger compartment is prohibited. Also, the electrostatic shielding effect of the inner shield portion 202a increases the detection sensitivity based on the detection signals of the third sensor electrode 212, 213 outside of the passenger compartment as compared to inside of the passenger compartment.

According to the present embodiment as described above, the following advantages are obtained in addition to the advantages of the first embodiment.

(1) In the present embodiment, when an object contacts or approaches the window glass 204 from outside of the passenger compartment and moves in the front-rear direction (in a certain direction) along and throughout the sensor electrodes 211 to 214, the detection signal of the second sensor electrode 211 remains unchanged and the detection signals of the other sensor electrodes 212 to 214 are changed. In contrast, when the object contacts or approaches the window glass 204 from inside of the passenger compartment and moves in the front-rear direction (in a certain direction) along and throughout the sensor electrodes 211 to 214, the detection signal of the first sensor electrode 214 remains unchanged and the detection signals of the other sensor electrodes 211 to 213 are changed. That is, the detection signals output from the sensor electrodes 211 to 214 are changed in different manners between manipulation from outside of the passenger compartment and manipulation from inside of the passenger compartment. In this manner, by arranging the shield electrodes 215, 217 and the inner shield portion 202a with respect to the identically configured sensor electrodes 211 to 214, the detection signals are changed in different manners depending on the state of manipulation. This improves the detection accuracy for distinction between manipulation by a person to the window glass 204 from outside of the passenger compartment and manipulation from inside of the passenger compartment.

(2) In the present embodiment, the inner shield portion 202a (the sensitivity decreasing shield electrode) decreases the detection sensitivity of the sensor electrodes 211 to 213. This further limits detectable contact or approach of an object (manipulation), thus restraining erroneous detection.

(3) In the present embodiment, the sensitivity decreasing shield electrode is configured by the door inner panel 202 (the inner shield portion 202a). This makes it unnecessary to arrange a dedicated electrode as a sensitivity adjusting electrode, thus decreasing the number of components.

The above-illustrated embodiments may be modified as follows.

In the first embodiment, the second shield electrode (the sensitivity decreasing shield electrode) 34 may be omitted.

In the first embodiment, the sensor electrodes 31, 32 may be aligned in any direction other than the up-down direction (for example, in the front-rear direction, which is a horizontal direction).

In the first embodiment, the shapes of the sensor electrodes 31, 32 may be substantially the same as each other.

The first embodiment may include multiple first sensor electrodes (31) and arrange first shield electrodes 33 for each of the first sensor electrodes (31). Also, the embodiment may include multiple second sensor electrodes (32) without arranging the first shield electrode 33 for any of the second sensor electrodes (32).

In the second embodiment, the first sensor electrode 111, which is located at the lower position, may have a greater surface area than the second sensor electrode 112, which is located at the upper position. Alternatively, the sensor electrodes 111, 112 may have substantially the same surface area.

In the third embodiment, the door inner panel 202 (the inner shield portion 202*a*), instead of the first shield electrode 215, may electrostatically shield the inner side of the first sensor electrode 214. This makes it unnecessary to arrange a dedicated electrode as the first shield electrode, thus decreasing the number of components.

In the third embodiment, the door outer panel 201 (the outer shield portion 201*a*), instead of the second shield electrode 217, may electrostatically shield the outer side of the second sensor electrode 211. This makes it unnecessary to arrange a dedicated electrode as the second shield electrode, thus decreasing the number of components.

In the third embodiment, the sensor electrodes 211 to 214 may be aligned in any direction other than the front-rear direction (for example, the up-down direction).

In the third embodiment, the sensor electrodes 211 to 214 may have mutually different shapes.

The third embodiment may include multiple first sensor electrodes (214) and arrange first shield electrodes 215 for each of the first sensor electrodes (214). Also, the embodiment may include multiple second sensor electrodes (211) and arrange second shield electrodes 217 for each of the second sensor electrodes (211). Further, the embodiment may have one or more than two third sensor electrodes (212, 213) without arranging the first shield electrode 215 or the second shield electrode 217 for any of the third sensor electrodes (212, 213).

In each of the illustrated embodiments, manipulation for opening the sliding door 3 and correspondingly unlocking the door lock 6 is defined as manipulation for selectively opening and closing the sliding door 3. Instead, only one of manipulation for opening the sliding door 3 and manipulation for unlocking the door lock 6 may be defined as the manipulation for selectively opening and closing the sliding door 3. Alternatively, at least one of manipulation for closing the sliding door 3 and manipulation for locking the door lock 6 may be defined as the manipulation for selectively opening and closing the sliding door 3.

In each of the illustrated embodiments, leaning of a person against the door from outside of the passenger compartment may be detected based on the detection signal (S2).

In each of the illustrated embodiments, the window glass (5, 104, 204) may be a windshield, a rear window, a quarter window, or a side window of a front door.

In the illustrated embodiments, the target of manipulation for selective opening and closing (the opening-closing body) may be, for example, the window glass 5, 104, 204 (a window regulator), a swing door, a hood, a trunk lid, or a fuel lid. Alternatively, the target may be a swivel seat capable of swiveling or a lifting seat capable of being lifted and lowered to assist entry and exit.

A vehicle manipulation detecting device including the sensor body 30 may include sensor electrodes that include at least a first sensor electrode and at least a second sensor electrode, as well as a shield electrode. The shield electrode is arranged at a position corresponding to the first sensor electrode on either the inner side or the outer side of the first sensor electrode.

In this configuration, when the shield electrode is arranged on the inner side of the first sensor electrode and manipulation (contact or approach of an object) to the window glass is carried out from outside of the passenger compartment of the vehicle, the detection signals of the first and second sensor electrodes are changed. If the manipulation to the window glass is carried out from inside of the passenger compartment, the detection signal of the first sensor electrode, for which the shield electrode is arranged, remains unchanged and the detection signal of the second sensor electrode is changed. Alternatively, when the shield electrode is arranged on the outer side of the first sensor electrode, the detection signals of the first and second sensor electrodes are changed in response to manipulation from inside of the passenger compartment. In contrast, the detection signal of the first sensor electrode remains unchanged and the detection signal of the second sensor electrode is changed in response to manipulation from outside of the passenger compartment. In this manner, even when the shield electrode is arranged on the outer side of the first sensor electrode, distinction is possible at the time of detection between contact or approach of an object, which is manipulation by a person, to the window glass from outside of the passenger compartment and manipulation from inside of the passenger compartment.

The invention claimed is:

1. A vehicle manipulation detecting device comprising:
   a plurality of sensor electrodes, wherein
      each of the sensor electrodes is configured to be attached to a window glass of a vehicle and output a detection signal corresponding to a capacitance changed in response to contact or approach of an object, and
      the sensor electrodes include at least one first sensor electrode and at least one second sensor electrode;
   a first shield electrode, which is arranged at a position corresponding to the first sensor electrode on an inner side of the first sensor electrode with reference to a passenger compartment of the vehicle; and
   a second shield electrode, which is arranged at a position corresponding to the second sensor electrode on an outer side of the second sensor electrode with reference to the passenger compartment, wherein
   the sensor electrodes include a third sensor electrode, and
   the first sensor electrode, the third sensor electrode, and the second sensor electrode are aligned in a certain direction along the window glass.

2. The vehicle manipulation detecting device according to claim 1, wherein the first shield electrode is configured by a door inner panel that is formed by a metal plate.

3. The vehicle manipulation detecting device according to claim 1, wherein the second shield electrode is configured by a door outer panel that is formed by a metal plate.

4. The vehicle manipulation detecting device according to claim 1, further comprising a sensitivity decreasing shield electrode, which covers part of the second sensor electrode from inside of the passenger compartment.

5. The vehicle manipulation detecting device according to claim 1, further comprising a sensitivity decreasing shield electrode, which covers part of the second sensor electrode and part of the third sensor electrode from inside of the passenger compartment.

6. A vehicle manipulation detecting device comprising:
a plurality of sensor electrodes, wherein
    each of the sensor electrodes is configured to be attached to a window glass of a vehicle and output a detection signal corresponding to a capacitance changed in response to contact or approach of an object, and
    the sensor electrodes include at least one first sensor electrode and at least one second sensor electrode;
a first shield electrode, which is arranged at a position corresponding to the first sensor electrode on either an inner side or an outer side of the first sensor electrode with reference to a passenger compartment of the vehicle; and
a second shield electrode, which is arranged at a position corresponding to the second sensor electrode on an outer side of the second sensor electrode with reference to the passenger compartment, wherein
the sensor electrodes include a third sensor electrode, and
the first sensor electrode, the third sensor electrode, and the second sensor electrode are aligned in a certain direction along the window glass.

7. The vehicle manipulation detecting device according to claim 6, wherein the first shield electrode is configured by a door inner panel that is formed by a metal plate.

8. The vehicle manipulation detecting device according to claim 6, wherein the second shield electrode is configured by a door outer panel that is formed by a metal plate.

9. The vehicle manipulation detecting device according to claim 6, further comprising a sensitivity decreasing shield electrode, which covers part of the second sensor electrode from inside of the passenger compartment.

10. The vehicle manipulation detecting device according to claim 6, further comprising a sensitivity decreasing shield electrode, which covers part of the second sensor electrode and part of the third sensor electrode from inside of the passenger compartment.

11. A vehicle manipulation detecting device comprising:
a plurality of sensor electrodes, wherein
    each of the sensor electrodes is configured to face a window glass of a vehicle and output a detection signal corresponding to a capacitance changed in response to contact or approach of an object, and
    the sensor electrodes include at least one first sensor electrode and at least one second sensor electrode;
a first shield electrode, which is arranged at a position corresponding to the first sensor electrode on an inner side of the first sensor electrode with reference to a passenger compartment of the vehicle; and
a second shield electrode, which is arranged at a position corresponding to the second sensor electrode on an outer side of the second sensor electrode with reference to the passenger compartment, wherein
the sensor electrodes include a third sensor electrode, and
the first sensor electrode, the third sensor electrode, and the second sensor electrode are aligned in a certain direction along the window glass.

12. The vehicle manipulation detecting device according to claim 11, wherein the first shield electrode is configured by a door inner panel that is formed by a metal plate.

13. The vehicle manipulation detecting device according to claim 11, wherein the second shield electrode is configured by a door outer panel that is formed by a metal plate.

14. The vehicle manipulation detecting device according to claim 11, further comprising a sensitivity decreasing shield electrode, which covers part of the second sensor electrode from inside of the passenger compartment.

15. The vehicle manipulation detecting device according to claim 11, further comprising a sensitivity decreasing shield electrode, which covers part of the second sensor electrode and part of the third sensor electrode from inside of the passenger compartment.

* * * * *